(12) United States Patent
Xotta et al.

(10) Patent No.: US 11,966,289 B2
(45) Date of Patent: Apr. 23, 2024

(54) CROSS-TEMPERATURE COMPENSATION IN NON-VOLATILE MEMORY DEVICES

(71) Applicant: Micron Technology, Inc., Boise, ID (US)

(72) Inventors: Andrea Giovanni Xotta, Cornedo Vicentino (IT); Umberto Siciliani, Rubano (IT)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 17/830,800

(22) Filed: Jun. 2, 2022

(65) Prior Publication Data
US 2023/0393936 A1    Dec. 7, 2023

(51) Int. Cl.
| | |
|---|---|
| H03M 13/11 | (2006.01) |
| G06F 11/07 | (2006.01) |
| G06F 11/10 | (2006.01) |
| G11C 16/10 | (2006.01) |
| G11C 16/26 | (2006.01) |
| G11C 16/34 | (2006.01) |
| H03M 13/00 | (2006.01) |
| H03M 13/03 | (2006.01) |
| H04L 1/00 | (2006.01) |
| H04L 1/1812 | (2023.01) |

(52) U.S. Cl.
CPC ........ *G06F 11/1068* (2013.01); *G06F 11/076* (2013.01); *G06F 11/0772* (2013.01); *G11C 16/102* (2013.01); *G11C 16/26* (2013.01); *G11C 16/3404* (2013.01)

(58) Field of Classification Search
CPC ... G11C 16/3404; G11C 16/26; G11C 16/102; G06F 11/0772; G06F 11/076; G06F 11/1068
See application file for complete search history.

(56) References Cited

U.S. PATENT DOCUMENTS

| | | | | |
|---|---|---|---|---|
| 10,685,711 | B1* | 6/2020 | Lin | G06F 3/0652 |
| 2013/0080858 | A1* | 3/2013 | Lee | G11C 11/5642 |
| | | | | 714/E11.054 |
| 2017/0053714 | A1* | 2/2017 | Guy | G11C 11/40626 |
| 2017/0271022 | A1* | 9/2017 | Watanabe | G11C 16/26 |
| 2019/0279735 | A1* | 9/2019 | Zeng | G11C 11/5642 |
| 2020/0363969 | A1* | 11/2020 | Shen | G06F 3/0634 |

* cited by examiner

*Primary Examiner* — Guy J Lamarre
(74) *Attorney, Agent, or Firm* — Lowenstein Sandler LLP

(57) ABSTRACT

Systems and methods are disclosed including a memory device and a processing device operatively coupled to the memory device. The processing device can perform operations comprising performing a first read operation on the memory device to retrieve first data; determining, from the first data, second data indicative of a write temperature associated with the first data, wherein the write temperature is indicative of a temperature measured during a write operation; determining a read voltage value based on the second data; and performing a second read operation on the memory device using the read voltage value to obtain the first data.

20 Claims, 6 Drawing Sheets

TEMPERATURE COMPENSATION DATA
STRUCTURE
410

| Temperature Compensation Value | Read Voltage Offset Value |
|---|---|
| 5 °C | $x_1$ V |
| 10 °C | $x_1$ V |
| 15 °C | $x_2$ V |
| 20 °C | $x_3$ V |
| 25 °C | $x_4$ V |
| 30 °C | $x_4$ V |
| ... | ... |
| ... | ... |
| ... | ... |
| ... | ... |
| ... | ... |
| n °C | $x_m$ V |

501/505: Written at HOTTER, READ at HOTTER
503: Written at HOTTER, READ at COLDER 531/535: Written at COLDER, READ at COLDER
533: Written at COLDER, READ at HOTTER

CROSS-TEMPERATURE COMPENSATION IN NON-VOLATILE MEMORY DEVICES

TECHNICAL FIELD

Embodiments of the disclosure relate generally to memory sub-systems, and more specifically, relate to cross-temperature compensation in non-volatile memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
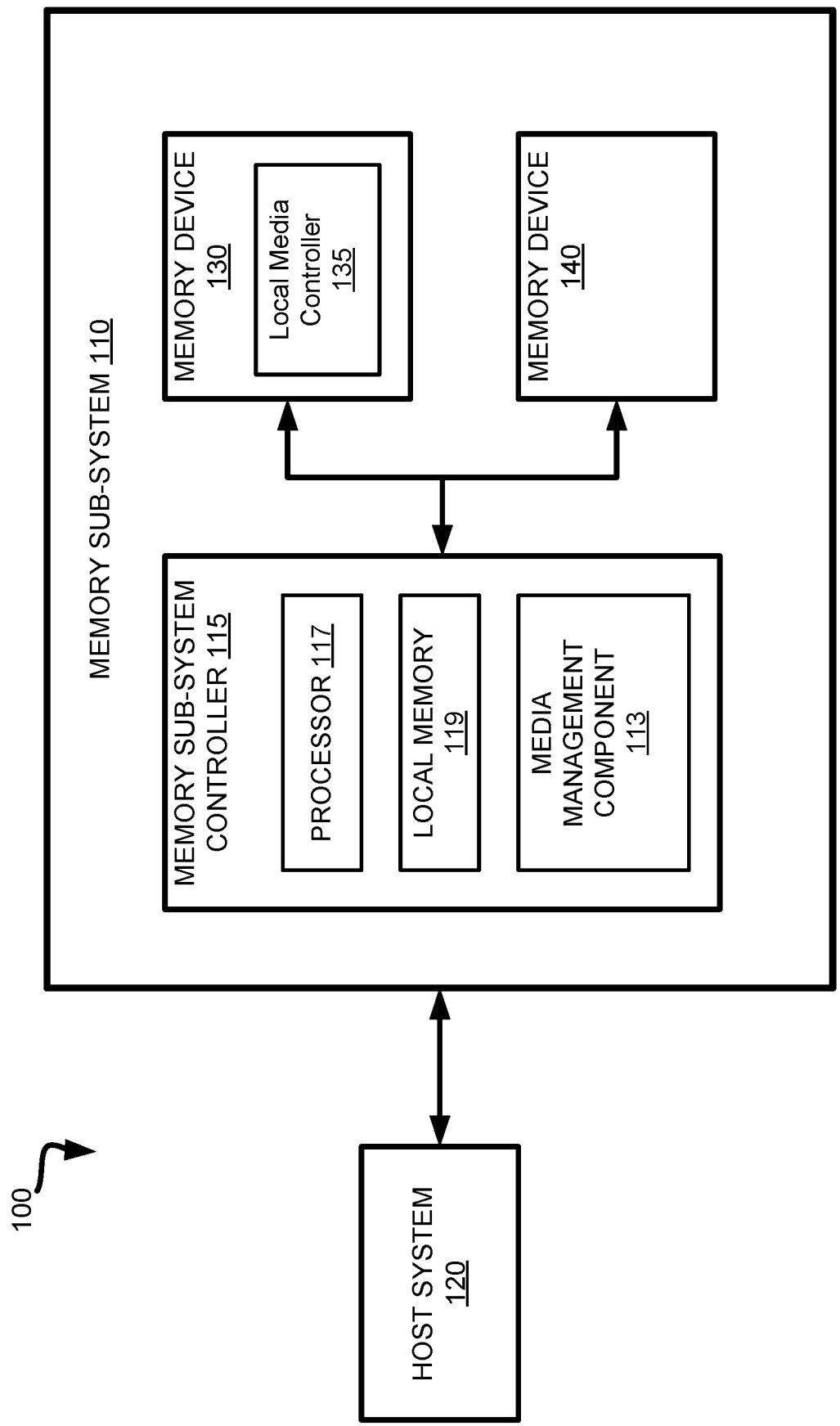
FIG. 1 illustrates an example computing system that includes a memory sub-system in accordance with some embodiments of the present disclosure.

Aspects of the present disclosure are directed to cross-temperature compensation in non-volatile memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Various data operations can be performed by the memory sub-system. The data operations can be host-initiated operations. For example, the host system can initiate a data operation (e.g., write, read, erase, etc.) on a memory sub-system. The host system can send access commands (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error-handling data (e.g., error correction code (ECC) codeword parity data), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, which is called as the "threshold voltage" and denoted as Vt.

Precisely controlling the amount of the electric charge stored by the memory cell allows establishing multiple logical levels, thus effectively allowing a single memory cell to store multiple bits of information. A read operation can be performed by comparing the measured threshold voltage ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

A memory device can have voltage distributions that are narrow compared with the working range of control voltages tolerated by the cells of the device. Accordingly, multiple distributions (with "valleys" between distributions) can be fit into the working voltage window allowing storing and reliably detecting multiple bits per cell such as $2^3=8$ distributions (7 valleys) for TLC, $2^2=4$ distributions (3 valleys) for MLC etc. The distributions are interspersed with voltage intervals ("valley margins") between distributions where none (or very few) of the memory cells of the device have their threshold voltages. Therefore, such valley margins can be used to separate various charge states—the logical state of the cell can be determined by detecting, during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N-1$ read voltages are applied to distinguish $2^N$ distributions. Specifically, the read operation can be performed by comparing the measured threshold voltage $V_T$ exhibited by the memory cell to one or more reference voltage levels corresponding to known valleys (e.g., centers of the valleys) of the memory device.

Under certain circumstances, the memory system can be operated in an environment with varying temperature (e.g., between −40 to 90 degrees Celsius). Temperature variations between a write operation with respect to a memory cell and a subsequent read operation with respect to the memory cell can impact the electric charge stored in and read from the memory cell. This change in temperature between the write operation with respect to the memory cell and the subsequent read operation with respect to the memory cell can be referred to as the cross temperature. Cross temperature conditions can occur, e.g., when the memory cell is programmed at a hotter temperature range (65-70° C.) and read at a colder temperature range (20-25° C.) or when the memory cell is programmed at a colder temperature range (20-25° C.) and read at a hotter temperature range (65-70° C.). For illustrative purposes, temperature ranges (20-25° C.) and (65-70° C.) are used, but other temperatures ranges are also possible.

Figure 5A:
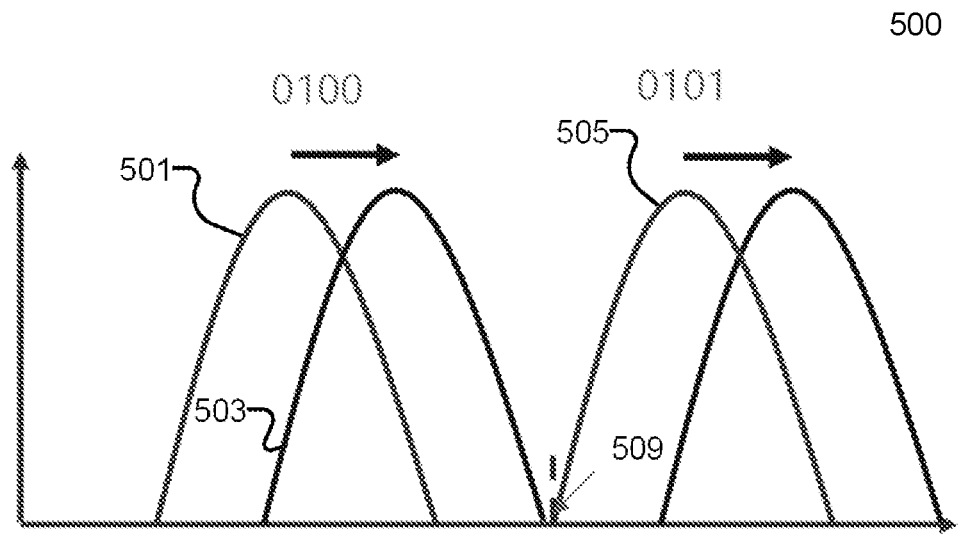
FIG. 5A is a block diagram illustrating voltage distribution shifts, in accordance with some embodiments of the present disclosure.

Referring to FIG. 5A, for one example, if a memory cell in a QLC memory is programmed with a voltage level of 2V corresponding to a data value of '0100' at 70° C., and the temperature changes over time to 25° C. when the memory cell is read, the voltage level may have shifted to 2.15V. Depending on how the threshold voltage ranges are defined in the memory cell, the actual read voltage may reflect a data value (e.g., '0101') that is different from the programmed data value. This shift can result in increased raw bit error rate (RBER) which can be beyond the error correction capability of the underlying error correction code (ECC).

Figure 5B:
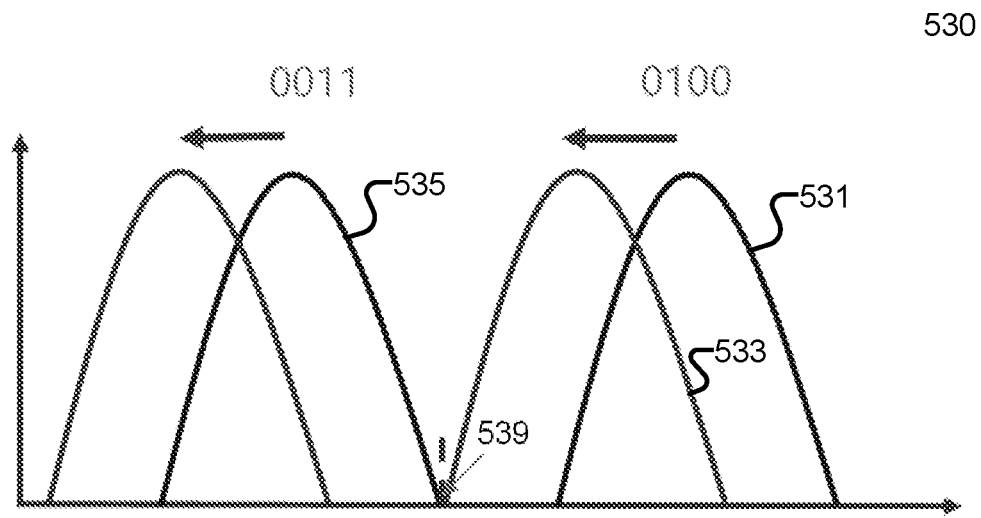
FIG. 5B is a block diagram illustrating voltage distribution shifts, in accordance with some embodiments of the present disclosure.

Referring to FIG. 5B, for another example, if a memory cell in a QLC memory is programmed with a voltage level of 2V corresponding to a data value of '0100' at 25° C., and the temperature changes over time to 70° C. when the memory cell is read, the apparent voltage level may have shifted to 1.85V. Depending on how the threshold voltage ranges are defined in the memory cell, the apparent read voltage may reflect a different data value (e.g., '0011'). This shift can result in increased raw bit error rate (RBER) which can be beyond the error correction capability of the underlying ECC.

In response to the RBER going beyond the error correction capability of the underlying ECC, some systems can perform a data recover flow in an attempt to recover the data. The data recover flow can include one or more error-handling operations with respect to the data items that have been retrieved from the memory device. In one example, an error handling operation can include one or more read retries using different parameters, such as a change in read voltage, as compared to the initial read operation performed on the memory cell. In another example, the error-handling operation can include "deep error handling techniques," such as forward error correction (FEC) with various versions of reliability information, hybrid automatic repeat request (HARQ), Soft-Bit Information requests (e.g., data pertaining to the reliability of the stored bits), Histogram elaboration (e.g., valley placement data), etc.

A trigger rate is an estimate of a frequency of implementing the data recover flow. A high trigger rate is associated with poor memory sub-system performance since the memory device requires additional computing and time resources to retrieve stored data.

Some memory sub-systems reduce the impact of cross-temperature conditions applying read voltage offsets based on the current memory device temperature during a read operation. However, these systems fail to consider the temperature of the memory device during a write operation. As such, these systems make assumptions (e.g., use a predetermined reference temperature) that may not be correct, thus leading to an increase RBER and increased trigger rate. Thus, mechanisms and methods for accurately determining cross-temperature compensation values are desirable.

Aspects of the present disclosure address the above and other deficiencies by performing cross-temperature compensation in memory devices. In an illustrative example, during a write operation, the memory sub-system controller can store a temperature value reflecting the current temperature of the memory device. This write temperature value can be stored as metadata appended to the host data of the write operation. During a read operation, the memory sub-system controller can retrieve the write temperature value and determine a read voltage to account for cross-temperature conditions. For example, the controller can extract the previously written write temperature value, determine a read offset voltage value reflecting the temperature difference between the write operation and a current temperature of the memory device, and the read offset voltage value to the read voltage level during the subsequent read operation. The read offset voltage value can be determined in response to the original read operation returning a high error rate.

In some embodiments, the memory sub-system controller can measure the temperature using a temperature-measuring device, such as a thermocouple, a thermometer, an infrared sensor, etc. The temperature-measuring device can be a hardware device that is part of and operated by the memory sub-system controller. In some embodiments, the memory sub-system controller can retrieve temperature data from the memory device. For example, the memory device can include a temperature-measuring device and the memory sub-system controller can periodically poll (e.g., once each second) the memory device to retrieve the temperature data. The memory sub-system controller can then append write temperature data (e.g., a temperature value) to the host data, and instruct the memory device to program the appended write data (host data appended with temperature data) to a memory location. In some embodiments, the memory sub-system controller can append write temperature data to each particular memory granularity (e.g., memory page, large memory page, memory sector, etc.) of a write command. For example, if a write command include five memory pages of host data, each of the memory pages can be appended with corresponding write temperature data.

In some embodiments, in response to receiving a read command, the memory sub-system controller can first determine a temperature compensation value by subtracting a default write temperature value (set during programming and/or calibration of the memory sub-system, by a firmware update, by user input, etc.) from the current temperature value (e.g., the current temperature of the memory sub-system), or vice versa. The memory sub-system controller can then determine a read offset voltage value using the temperature compensation value. The read offset voltage value can be a voltage offset value that is applied to a base read voltage value to generate an adjusted read voltage value. The adjusted read voltage value can be applied to a set of memory cells during read operations. To determine the read offset voltage value that correlates to the temperature compensation value, the memory sub-system controller can perform a lookup in a data structure, apply a formula or an equation to the read offset voltage value, etc. The memory sub-system controller can then execute the read command using the adjusted read voltage value and receive the appended read data referenced by the read command.

The memory sub-system controller can obtain the write temperature data from the appended read data and updates the current write temperature data related to the read command. The memory sub-system controller can perform a data integrity check on the retrieved host data to verify that the data stored at the memory cells of the memory page does not include any errors, or that the number of errors are below a predetermined threshold. The data integrity check can identify one or more data integrity metrics (e.g., BEC, RBER, etc.), and compare the value of the data integrity metric to a threshold criterion. If the data integrity metric satisfies a threshold criterion (e.g., BEC or RBER value is above a threshold value), indicating a high error rate associated with data stored at the memory page, the memory sub-system controller can determine a new temperature compensation value using a new current temperature value and the write temperature value from the appended read data. The memory sub-system controller can then determine a new adjusted read voltage value using the new temperature compensation value, and execute the read command using the new adjusted read voltage value. If the data integrity metric fails to satisfy the threshold criterion (e.g., BEC or RBER value is below a threshold value), the memory sub-system controller can use the adjusted read voltage value on subsequent read commands.

Advantages of the present disclosure include, but are not limited to, an improved performance of the memory sub-system by reducing the trigger rate due to cross-temperature conditions. Since the trigger rate is reduced, this can result in an improvement of performance, reliability, and operational life of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DEVIM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a media management component 113 that can be used to append write temperature data to user data and to determine temperature compensation values for read operations performed on the memory device 130 and the memory device 140. In some embodiments, the memory sub-system controller 115 includes at least a portion of the media management component 113. In some embodiments, the media management component 113 is part of the host system 120, an application, or an operating system. In other embodiments, local media controller 135 includes at least a portion of media management component 113 and is configured to perform the functionality described herein. The media management component 113 can communicate directly with the memory devices 130 and 140 via a synchronous interface. Furthermore, transfers of data between the memory device 130 and the memory device 140 can be done within the memory sub-system 110 without accessing the host system 120.

The media management component 113 can determine write temperature data for each write operation performed on the memory devices 130, 140, and append the write temperature data to the host data of the corresponding write operation. The media management component can further determine a temperature compensation value and use the temperature compensation value to determine a read offset value to be used during read operations on the memory devices 130, 140. Further details with regards to the operations of the media management component 113 are described below.

In some embodiments, memory sub-system controller 115, memory device 130, and/or memory device 140 can include a temperature-measuring device. The temperature-measuring device can be a thermocouple, a thermometer, an infrared sensor, or any other tool capable of determining temperature data (e.g., an operating temperature value). In some embodiments, the temperature-measuring device can be a hardware device that is part of and operated by the memory sub-system controller 115. In some embodiments, the temperature-measuring device can be a hardware device that is part of and operated by the memory device 130, 140. In such embodiments, the memory device 130, 140 can periodically send the temperature data to the media management component 113, and/or the media management component 113 can request (e.g., using polling or other request methods) the temperature data from the memory device 130, 140.

Once received by the media management component 113, the temperature data can be stored in a register (e.g., an 8-bit register) that is part of temperature compensation component 113, in a specific memory location on a volatile memory device (e.g., memory device 140), in a memory cache on local memory 119, in a data structure (a format having a set of data values, the relationships among them, and/or the functions or operations that can be applied to the data values), etc. In some embodiments, each subsequent received or determined temperature data can replace the previously stored temperature data. For example, each new operating temperature value received, by the media management component 113 from the memory device 130, 140, can replace the operating temperature value previously stored in a memory cache or register on the memory sub-system controller 115. In other embodiments, multiple sets of temperature data can be stored by the media management component 113.

Figure 2:
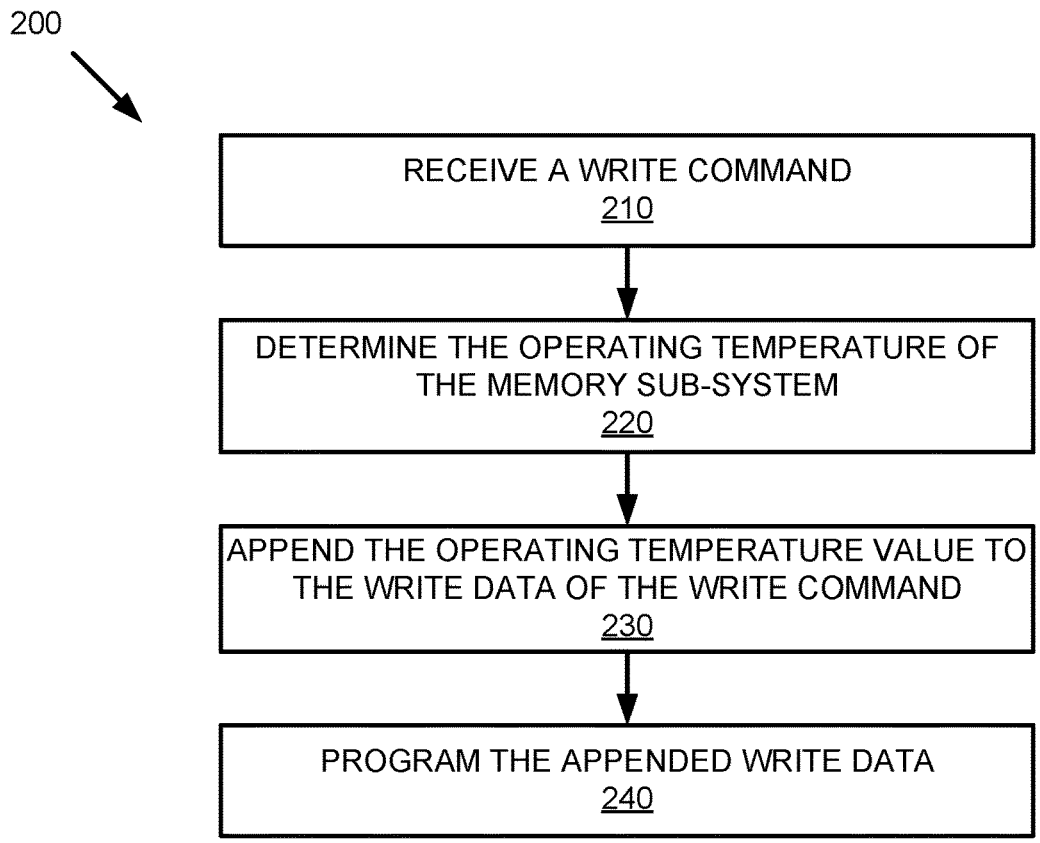
FIG. 2 is a flow diagram of an example method for performing a write operation, in accordance with some embodiments of the present disclosure.

FIG. 2 is a flow diagram of an example method 200 for performing write operations, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a write command. The write command can be initiated by a host (e.g., host 120) or by a memory sub-system controller (e.g., memory sub-system controller 113). In some embodiments, responsive to receiving the write command, the processing logic identifies one or more wordlines that address a set of memory cells (e.g., a page(s)) onto which to program the data referenced by the write command.

At operation 220, the processing logic determines the operating temperature of the memory sub-system. In some embodiments, the processing logic determines the operating temperature of the memory device sub-system 110 by performing a temperature reading using a temperature-measuring device connected to the memory sub-system controller 115. For example, the processing logic can obtain an operating temperature value from the temperature-measuring device.

In some embodiments, the processing logic requests, from the memory device (e.g., memory device 130, 140), the operating temperature value from a temperature-measuring device connected to memory device 130, 140. In response to the request, the processing logic can receive, from the memory device 130, 140, operating temperature value retrieved from the temperature-measuring device.

In some embodiments, the processing logic obtains the operating temperature value from the memory device using a polling method. For example, the processing logic can periodically request and/or receive, from the memory device 130, 140, an operating temperature value. The operating temperature value can be stored in, for example, a memory cache located on the memory sub-system controller 115 or memory device 140. To determine the temperature of the memory-subsystem at operation 220, the processing logic can retrieve the last received temperature value stored on the cache or register.

At operation 230, the processing logic appends the operating temperature value (e.g., write temperature value) to the write data of the write command. Write data can include data for the processing logic to program to the memory device. For example, the write temperature value can be added as metadata to the write data. Other metadata that can be added to the write data includes error-handling data (e.g., error correction code (ECC) codeword parity data), data version, valid bitmap (which LBAs or logical transfer units contain valid data), etc. In some embodiments, the processing logic can append the write temperature value for memory page referenced by the write operation. For example, if the write command includes write data to be programed to three memory pages, the processing logic can append the operating temperature value(s) to each memory page of data. In other embodiments, the write temperature value can be appended to any size granularity of data. In some embodiments, the processing logic can encode the operating temperature value using, for example, ECC codeword parity data.

At operation 240, the processing logic programs the appended write data (e.g., the write data and the write temperature value) to the identified set of memory cells. For example, the appended write data can be retrieved from a memory device or a cache and programmed onto the memory cells. To program the appended write data, the processing logic can apply a certain voltage to each memory cell, which results in an electric charge being held by each memory cell.

Figure 3:
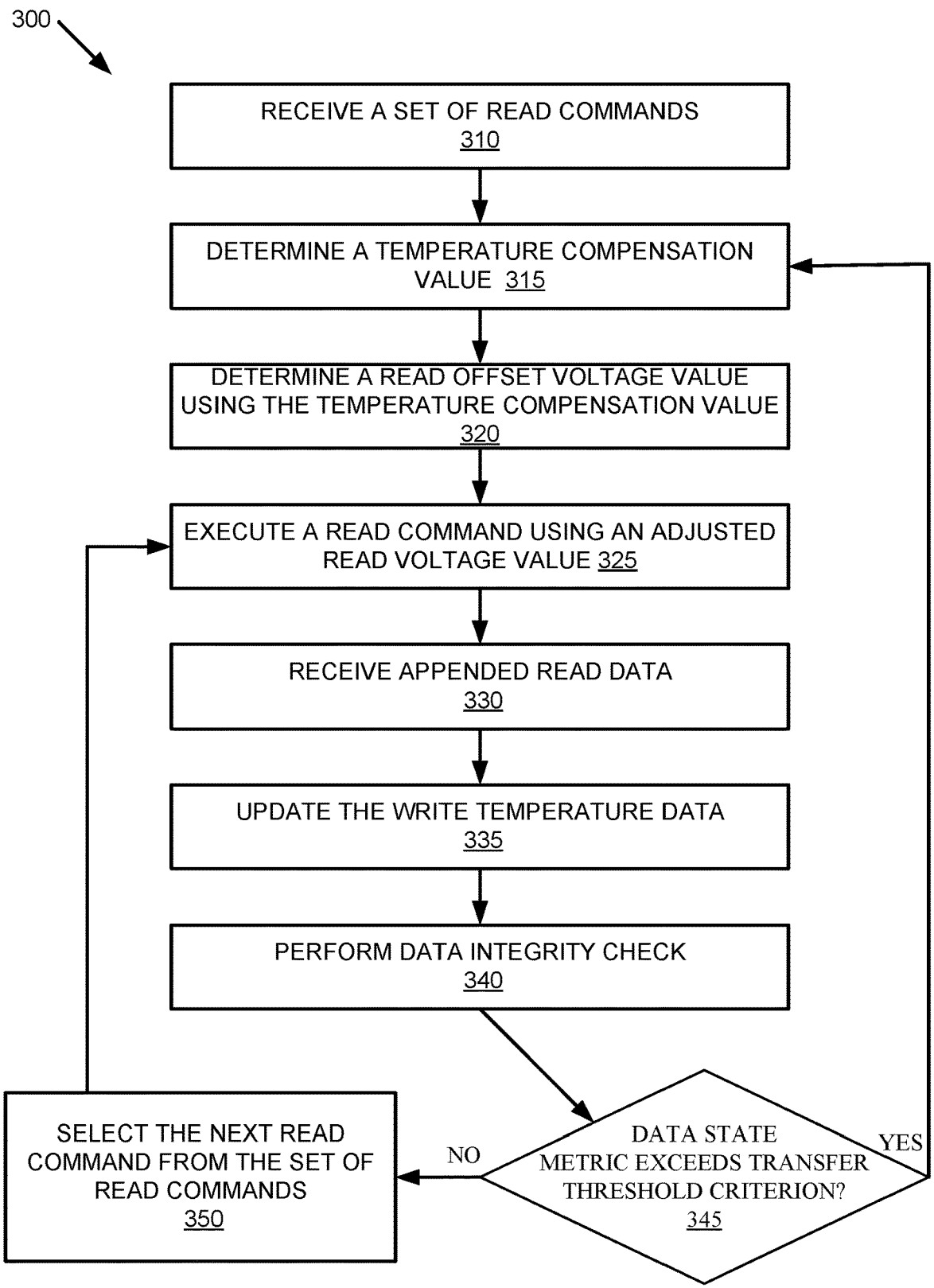
FIG. 3 is a flow diagram of an example method for performing a read operation, in accordance with some embodiments of the present disclosure.

FIG. 3 is a flow diagram of an example method 300 for performing a read operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic receives a set of read commands addressing a set of memory pages of a block. In one example, the set of read commands can be sequential read commands for data stored at various memory pages or sequential memory pages on the same word line. In another example, the set of read commands can be random read commands for data stored at different word lines of the memory device. In some embodiments, each read command of the set of read command can address a corresponding page. In other embodiments, each read command can address any sized granularity of memory. In some embodiments, the processing logic can receive a single read command addressing a set of memory pages of a block. Accordingly, the processing logic can issue a separate read command for each memory page referenced in the single read command.

At operation 315, the processing logic determines a temperature compensation value. In some embodiments, the temperature compensation value can be calculated by subtracting the write temperature value from the current temperature value (e.g., the current temperature of the memory sub-system 110), or vice versa. Accordingly, to determine the temperature compensation value, the processing logic can determine the current temperature of the memory sub-system 110 (using, for example, the temperature-measuring device), and determine a write temperature value corresponding the set of read commands.

To determine the write temperature value, the processing logic can retrieve the latest write temperature value stored in a register, a dedicated memory location, a cache, etc. In particular, the processing logic can perform a read operation on a memory page and retrieve the write temperature from the appended temperature data. The processing logic can then store the write temperature value in the register, the dedicated memory location, the cache, etc. The write temperature value can be updated from the appended temperature data from each subsequent read command. This operation of retrieving the write temperature value from the appended temperature data can be performed in response to executing a read operation (e.g., operation 325, discussed below) in response to the data integrity metric failing to satisfy a threshold criterion (e.g., operation 345, discussed below), or in response to any other operation of method 300.

In embodiments where the write temperature value is not yet known (e.g., not stored in the register, the dedicated memory location, the cache, etc.), such as when none of read command of the set of read commands have been performed (thus the write temperature value has not been retrieved from the appended write data), the processing logic can determine the temperature compensation value using a default write temperature value. The default write temperature value can be set during programming and/or calibration of the memory sub-system 110, by a firmware update, by user input, etc. In some embodiments, the default write temperature value can be stored in the in the register, the dedicated memory location, the cache, etc., and updated with the actual write temperature data after said data is retrieved during a read operation.

Figure 4:
FIG. 4 is an illustrative example of a temperature compensation data structure, in accordance with some embodiments of the present disclosure

At operation 320, the processing logic determines a read offset voltage value using the temperature compensation value. The read offset voltage value can be a voltage offset value that is applied to a base read voltage value to generate an adjusted read voltage value. The adjusted read voltage value can be applied to a set of memory cells during read operations. To determine the read offset voltage value that correlates to the temperature compensation value, the processing logic can perform a lookup in a temperature compensation data structure, apply a formula or an equation to the temperature compensation value, etc. For example, FIG. 4 an illustrative example of temperature compensation data structure 410, in accordance with some embodiments of the present disclosure. Each entry in data structure 410 includes a temperature compensation value (e.g., 5° C., 10° C., etc.) and the read voltage offset (e.g., $x_1$ V, $x_2$ V, etc.) value for each temperature compensation value. In some embodiments, the determined temperature compensation value can be stored in a specific register as part of media management component 113, in a dedicated memory location on a volatile memory device (e.g., memory device 140), in a cache on local memory 119, etc.

At operation 325, the processing logic executes a read command using the adjusted read voltage value. The processing logic can determine the adjusted read voltage value by adding the read voltage offset value to the base read voltage value. In an example, the processing logic can instruct the memory device to perform a read operation, on the memory page referenced by the read command, using adjusted read voltage value. In another example, the processing logic can send the read voltage offset value to the memory device, which can determine the adjusted read voltage value by adding the voltage-offset value to the base read value.

At operation 330, the processing logic receives the appended read data. For example, the memory device can retrieve the appended read data stored at the address referenced by the read command, and send the retrieved appended read data to the media management component 113. The appended read data can include the host data and the write temperature value for the host data.

At operation 335, the processing logic updates the current write temperature data related to the set of read commands. For example, the processing logic can store the write temperature data in a specific register as part of media management component 113, in a dedicated memory location on a volatile memory device (e.g., memory device 140), in local memory 119, etc.

At operation 340, the processing logic performs a data integrity check on the retrieved host data. The data integrity check can verify that the data stored at the memory cells of the memory page does not include any errors, or that the number of errors are below a predetermined threshold. During a scan operation, the processing logic identifies one or more data integrity metrics, such as the bit error count (BEC) or the raw bit error rate (RBER), representing a number of bit errors per unit of time that the data stored at the data block experiences. In some embodiments, during the data integrity check, the processing logic reads a raw code word (i.e., a series of a fixed number of bits) from the page. The processing logic can apply the code word to an error correcting code (ECC) decoder to generate a decoded code word and compare the decoded code word to the raw code word. The processing logic can count a number of flipped bits between the decoded code word and the raw code word, with a ratio of the number of flipped bits to the total number of bits in the code word representing the RBER.

At operation 345, the processing logic determines whether a value of the data integrity metric (e.g., a BEC value, a RBER value, etc.) satisfies a threshold criterion (e.g., meets or exceeds a threshold value, is lower than a threshold value, etc.). The threshold criterion can be determined and set during manufacturing of the memory sub-system 110 or during programming and/or calibration of the memory sub-system 110. In some embodiments, the threshold criterion can reflect whether the processing logic can correct the errors using the ECC. In an example, the processing logic can determine whether an RBER value or a BEC value exceeds a threshold value.

If the data integrity metric satisfies a threshold criterion (e.g., BEC or RBER value is above a threshold value), indicating a high error rate associated with data stored at the block, the processing logic proceeds to operation 315, where the processing logic determines a new temperature compensation value using a new current temperature value and the write temperature value from operation 335. The processing logic can then determine a new adjusted read voltage value using the new temperature compensation value, and execute the read command using the new adjusted read voltage value.

If the data integrity metric fails to satisfy the threshold criterion (e.g., BEC or RBER value is below a threshold value), the processing logic proceeds to operation 350, where the processing logic selects the next read command from the set of read commands, and then proceeds to operation 325, where the processing logic executes the next read command using the adjusted read voltage value.

FIG. 5A is a block diagram illustrating voltage distribution shifts in accordance with some embodiments of the present disclosure. As shown on FIG. 5A, voltage distributions 500 illustrates two levels '0100' and '0101' of a 16 level QLC memory cell storing four bits of data. A memory cell may be programmed to store the logical data value '0100' corresponding to distribution 501 at a hotter temperature range by applying a sequence of programming pulses to the memory cell until a program voltage level reaches the range of values within distribution 501. As a temperature associated with the memory cell changes over time to a colder temperature range (such as over a time period between when the memory cell is programmed and when the memory cell is read), the program voltage level (or apparent read voltage) may be affected and the program voltage level associated with distribution 501 shifts to distribution 503. Since distribution 503 falls within range of a distribution associated with a logical state value '0101' (distribution 505), there exists the possibility of a read error. For example, the read voltage level 509 may be decoded as corresponding to logical state '0101' instead of '0100'.

FIG. 5B is a block diagram illustrating voltage distribution shifts in accordance with some embodiments of the present disclosure. As shown on FIG. 5B, voltage distributions 530 is illustrated for two levels '0100' and '0011' of a 16 level QLC memory cell storing four bits of data. The memory cells may be programmed to store the logical data value '0100' corresponding to distribution 531 at a colder temperature range by applying a sequence of programming pulses to the memory cell until a program voltage level reaches the range of values within distribution 531. As a temperature associated with the memory cell changes over time to a hotter temperature range (such as over a time period between when the memory cell is programmed and when the memory cell is read), the program voltage level (or apparent read voltage) may be affected and the program voltage level associated with distribution 531 shifts to distribution 533. Since distribution 533 falls within range of a distribution associated with a logical state value '0011' (distribution 335), there exists the possibility of a read error. For example, the read voltage level 539 may be decoded as corresponding to logical state '0011' instead of '0100'.

Figure 6:
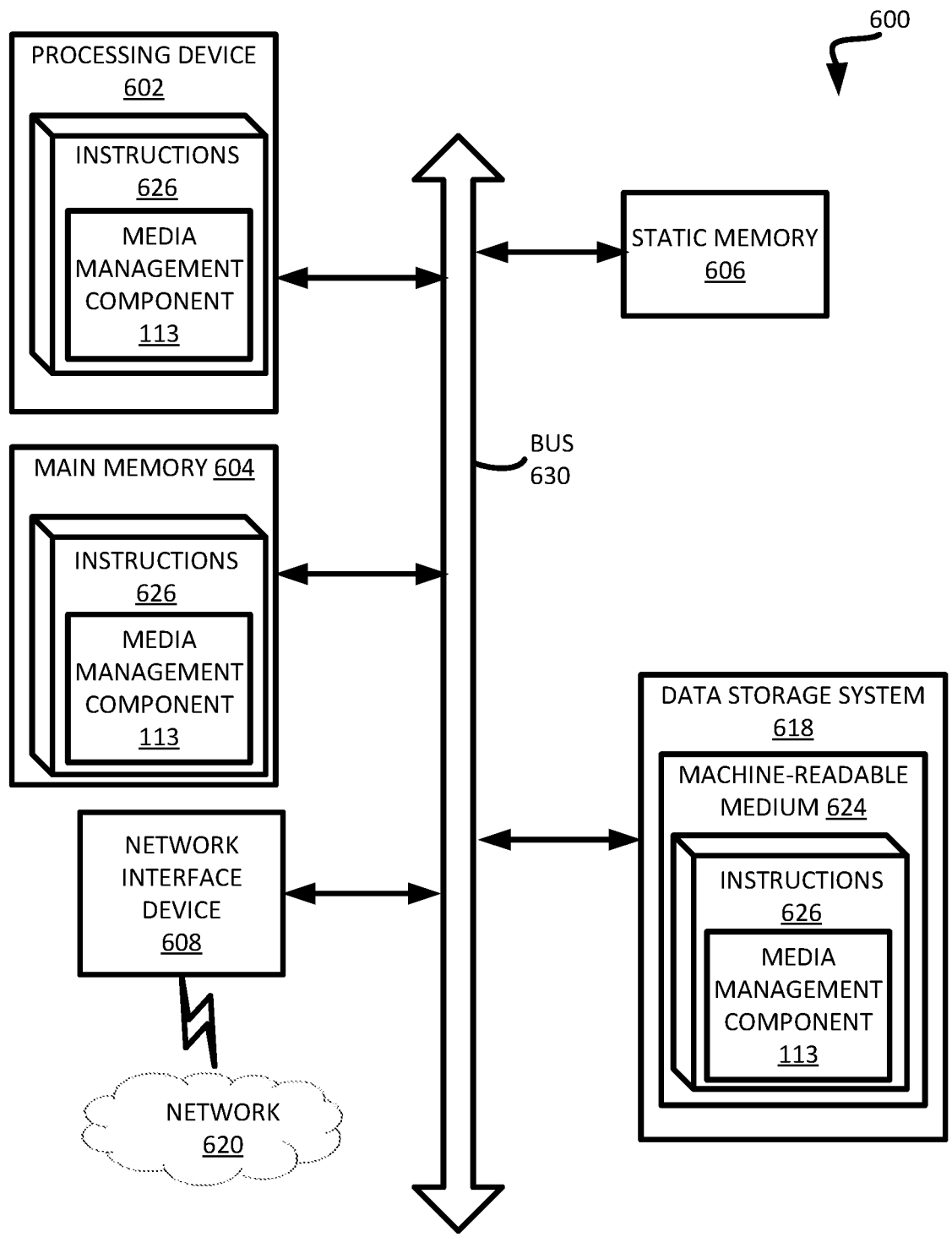
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to media management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to media management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A system comprising:
a memory device; and
a processing device, operatively coupled to the memory device, to perform operations comprising:
performing a first read operation on the memory device to retrieve first data;
determining, from the first data, second data indicative of a write temperature associated with the first data, wherein the write temperature is indicative of a temperature measured during a write operation;

determining a read voltage value based on the second data; and
performing a second read operation on the memory device using the read voltage value to obtain the first data.

2. The system of claim 1, wherein the first data comprises host data and a write temperature.

3. The system of claim 1, wherein the processing device is to perform further operations comprising:
receiving a write command comprising host data;
determining an operating temperature value of the memory device; and
programming, to the memory device, the host data and a value reflecting the operating temperature.

4. The system of claim 1, wherein the processing device is to perform further operations comprising:
determining a data integrity metric value associated with the first data; and
responsive to determining that the data integrity metric value satisfies a threshold criterion, determining the read voltage value based on the second data.

5. The system of claim 4, wherein the data integrity metric value reflects at least one of: a bit error count (BEC) or a raw bit error rate (RBER).

6. The system of claim 4, wherein the threshold criterion indicates whether the processing device is capable of correcting errors using an error correcting code, and wherein the data integrity metric value satisfies the threshold criterion if the data integrity value is greater than a threshold value.

7. The system of claim 1, wherein the processing device is to perform further operations comprising:
responsive to determining that the first data obtained from the second read operation passes a data integrity check, performing a third read operation to obtain third data using the read voltage value.

8. The system of claim 1, wherein determining the read voltage value comprises:
determining a temperature compensation value based on the second data and a current temperature value;
determining a read offset voltage value based on the temperature compensation value; and
applying the read offset voltage value to a base read voltage value.

9. The system of claim 8, wherein determining the read offset voltage value comprises at least one of performing a lookup in a data structure or applying a formula to the temperature compensation value.

10. The system of claim 1, wherein the second data is stored on at least one of a specified register, a specific memory location on a volatile memory device, or a local memory of a memory sub-system controller.

11. A method, comprising:
receiving, by a processor, first data obtained from a memory page of a memory device, wherein the first data comprises host data and write temperature data, wherein the memory page is referenced by a first read command of a set of read commands;
determining a read voltage value based on the write temperature data; and
instructing a memory device to perform a read operation on a second memory page referenced by a second read command of the set of read command by applying the read voltage value to the second memory page.

12. The method of claim 11, further comprising:
receiving a write command comprising the host data;
determining an operating temperature value of the memory device; and
programming, to the memory device, the host data and a value reflecting the operating temperature.

13. The method of claim 11, further comprising:
responsive to determining that a data integrity metric value satisfies a threshold criterion, determining a new read voltage value based on new write temperature data obtained from the second memory page.

14. The method of claim 11, wherein determining the read voltage value comprises:
determining a temperature compensation value based on the write temperature data and a current temperature value;
determining a read offset voltage value based on the temperature compensation value; and
applying the read offset voltage value to a base read voltage value.

15. The method of claim 14, wherein determining the read offset voltage value comprises at least one of performing a lookup in a data structure or applying a formula to the temperature compensation value.

16. A non-transitory computer-readable storage medium comprising instructions that, when executed by a processing device operatively coupled to a memory, performs operations comprising:
performing a first read operation on a memory device to retrieve first data;
determining, from the first data, second data indicative of a write temperature associated with the first data;
determining a read voltage value based on the second data; and
performing a second read operation on the memory device using the read voltage value to obtain the first data.

17. The non-transitory computer-readable storage medium of claim 16, wherein the processing device is to perform further operations comprising:
receiving a write command comprising host data;
determining an operating temperature value of the memory device; and
programming, to the memory device, the host data and a value reflecting the operating temperature.

18. The non-transitory computer-readable storage medium of claim 16, wherein the processing device is to perform further operations comprising:
determining a data integrity metric value associated with the first data; and
responsive to determining that the data integrity metric value satisfies a threshold criterion, determining the read voltage value based on the second data.

19. The non-transitory computer-readable storage medium of claim 16, wherein the processing device is to perform further operations comprising:
responsive to determining that the first data obtained from the second read operation passes a data integrity check, performing a third read operation to obtain third using the read voltage value.

20. The non-transitory computer-readable storage medium of claim 16, wherein determining the read voltage value comprises:
determining a temperature compensation value based on the second data and a current temperature value;
determining a read offset voltage value based on the temperature compensation value; and applying the read offset voltage value to a base read voltage value.

\* \* \* \* \*